United States Patent [19]

Baliga

[11] Patent Number: 4,743,952
[45] Date of Patent: May 10, 1988

[54] INSULATED-GATE SEMICONDUCTOR DEVICE WITH LOW ON-RESISTANCE

[75] Inventor: Bantval J. Baliga, Clifton Park, N.Y.

[73] Assignee: General Electric Company, Schenectady, N.Y.

[21] Appl. No.: 482,075

[22] Filed: Apr. 4, 1983

[51] Int. Cl.⁴ ............................................. H01L 29/78
[52] U.S. Cl. .................................... 357/23.4; 357/38; 357/86
[58] Field of Search ...................... 357/23.4, 23.14, 41, 357/86, 37, 38

[56] References Cited

U.S. PATENT DOCUMENTS

| | | | |
|---|---|---|---|
| 3,999,207 | 12/1976 | Arai | 357/22 |
| 4,345,265 | 8/1982 | Blanchard | 357/23.4 |
| 4,364,073 | 12/1982 | Becke et al. | 357/23 |
| 4,455,565 | 6/1984 | Goodman et al. | 357/14 MG |
| 4,523,111 | 6/1985 | Baliga | 357/23.4 |
| 4,543,596 | 9/1985 | Strack et al. | 357/23.4 |
| 4,630,084 | 12/1986 | Tihanyi | 357/43 X |
| 4,641,163 | 2/1987 | Tihanyi | 357/23.4 |

FOREIGN PATENT DOCUMENTS 3103444 10/1982 Fed. Rep. of Germany ..... 357/23.4
2062349 5/1981 United Kingdom .......... 357/23 VD

OTHER PUBLICATIONS

R. S. Miller & T. I. Kamins, *Device Electronics for Integrated Circuits*, New York: John Wiley & Sons, (1979), pp. 105, 111 and 112.
B. J. Baliga, "Bipolar Operation of Power Junction Field-Effect Transistors", Electronics Letters, vol. 16, (Apr. 1980), pp. 300–301.

Primary Examiner—Andrew J. James
Assistant Examiner—Sara W. Crane
Attorney, Agent, or Firm—Robert Ochis; James C. Davis, Jr.; Marvin Snyder

[57] ABSTRACT

An insulated-gate semiconductor device includes an IGFET with channel, base, drift and drain regions, and further includes source and drain electrodes attached to at least the base region and to the drain region, repectively. The device further includes a carrier injection region which adjoins the IGFET drift region and forms a P-N junction therewith. Biasing structure connected to the carrier injection region and effective during the on-state of the device is provided for forward biasing the P-N junction by an amount sufficient to induce injection of carriers from the carrier injection region, across the P-N junction, and into the IGFET drift region. As a consequence, the on-resistance of the device is markedly reduced.

20 Claims, 2 Drawing Sheets

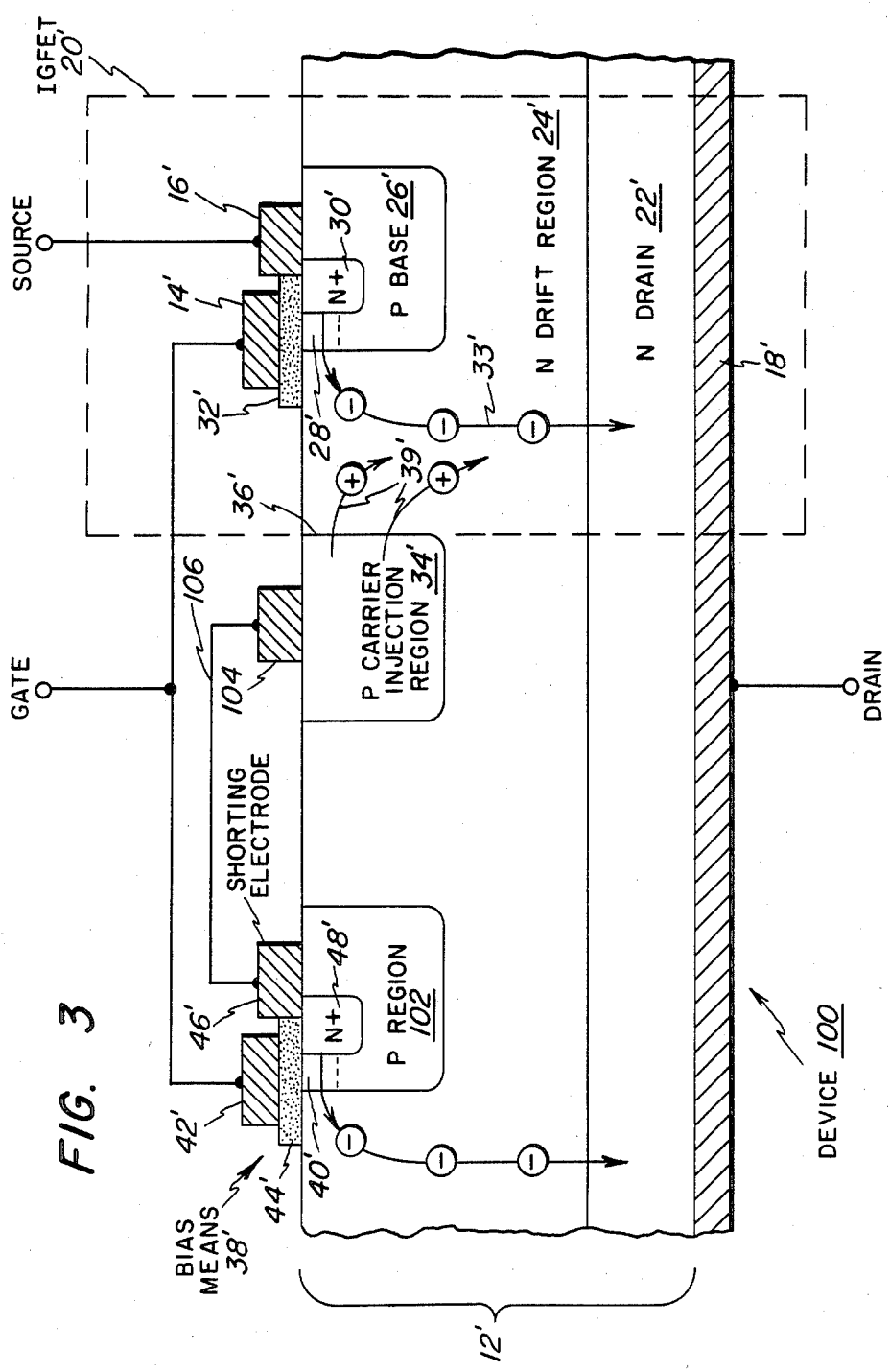

4,743,952

INSULATED-GATE SEMICONDUCTOR DEVICE WITH LOW ON-RESISTANCE

CROSS-REFERENCE TO RELATED APPLICATION

The present application is related to U.S. patent application, Ser. No. 473,089, now U.S. Pat. No. 4,523,111, entitled NORMALLY-OFF GATE-CONTROLLED ELECTRICAL CIRCUIT WITH LOW ON-RESISTANCE, by B. J. Baliga (the present inventor), assigned to the present assignee and the entirety of which is hereby incorporated by reference.

BACKGROUND AND SUMMARY OF THE INVENTION

The present invention relates to an insulated-gate semiconductor device and, more particularly, to such device having low on-resistance.

Insulated-gate semiconductor devices possess the desirable feature of having a high-impedance gate, which minimizes the requirements for gate-drive circuitry. One prior art insulated-gate semiconductor device comprises an insulated-gate field-effect transistor (IGFET), a particular version of which is a metal-oxide semiconductor field-effect transistor (MOSFET). An IGFET may be of the normally-off type, wherein it cannot conduct current unless its gate is actively biased. Such normally-off device comprises a body of semiconductor material containing, in successive adjacent arrangement, a highly-doped N conductivity type (or "N+") source region, a moderately-doped P conductivity type (or "P") base region, a moderately-to-lightly-doped N conductivity type (or "N") drift region, and a highly-doped N conductivity type (or "N+") drain region. Source and drain electrodes are attached to the source and drain regions, respectively, and are adapted to be connected to external circuitry for carrying load current that flows through the device.

In the foregoing IGFET, the N drift region doping concentration is selected to be moderate to low, for example below about $10^{14}$ dopant atoms per cubic centimeter, so that the device is capable of supporting large voltages between its source and drain electrodes without becoming conductive in its forward blocking state. The low conductivity of the N drift region, however, has the undesirable consequence of increasing the on-resistance, or resistance during forward conduction, of the IGFET. This severely limits the current rating of the device.

It is an object of my invention, therefore, to provide an insulated-gate semiconductor device that is capable of supporting large forward blocking voltages and yet which has a low on-resistance.

A further object of my invention is to provide an insulated-gate semiconductor device with low on-resistance that exhibits normally-off performance.

Another object of my invention is to provide an insulated-gate semiconductor device with low on-resistance that is compact in size.

In brief summary, in accordance with a preferred embodiment of my invention, I provide an insulated-gate semiconductor device which includes an IGFET having, in successive adjacent arrangement, an N+ source region, a P base region, an N drift region, and an N+ drain region. Source and drain electrodes are attached to the N+ source and drain regions, respectively, and constitute the main current-carrying electrodes of the device. The semiconductor device further includes both a P carrier injection region adjoining the N drift region so as to form a P-N junction therewith and a bias means connected to this P carrier injection region. The bias means is effective during the on-state of the semiconductor device to forward-bias the aforementioned P-N junction by a voltage sufficient to induce injection of holes (minority current carriers) across the P-N junction, from the P carrier injection region to the N drift region. The increase in hole population in the drift region induces a like increase in the electron population in the drift region, thereby reducing the on-resistance of the drift region and the semiconductor device by several orders of magnitude.

BRIEF DESCRIPTION OF THE DRAWINGS

While the specification concludes with claims particularly pointing out and distinctly claiming the subject matter which I regard as my invention, it is believed that the invention will be better understood with reference to the following description, taken in conjunction with the drawings, in which:

FIG. 3 is a schematic view in cross-section of a portion of a semiconductor device in accordance with a further embodiment of my invention.

DESCRIPTION OF THE PREFERRED EMBODIMENTS

Figure 1:
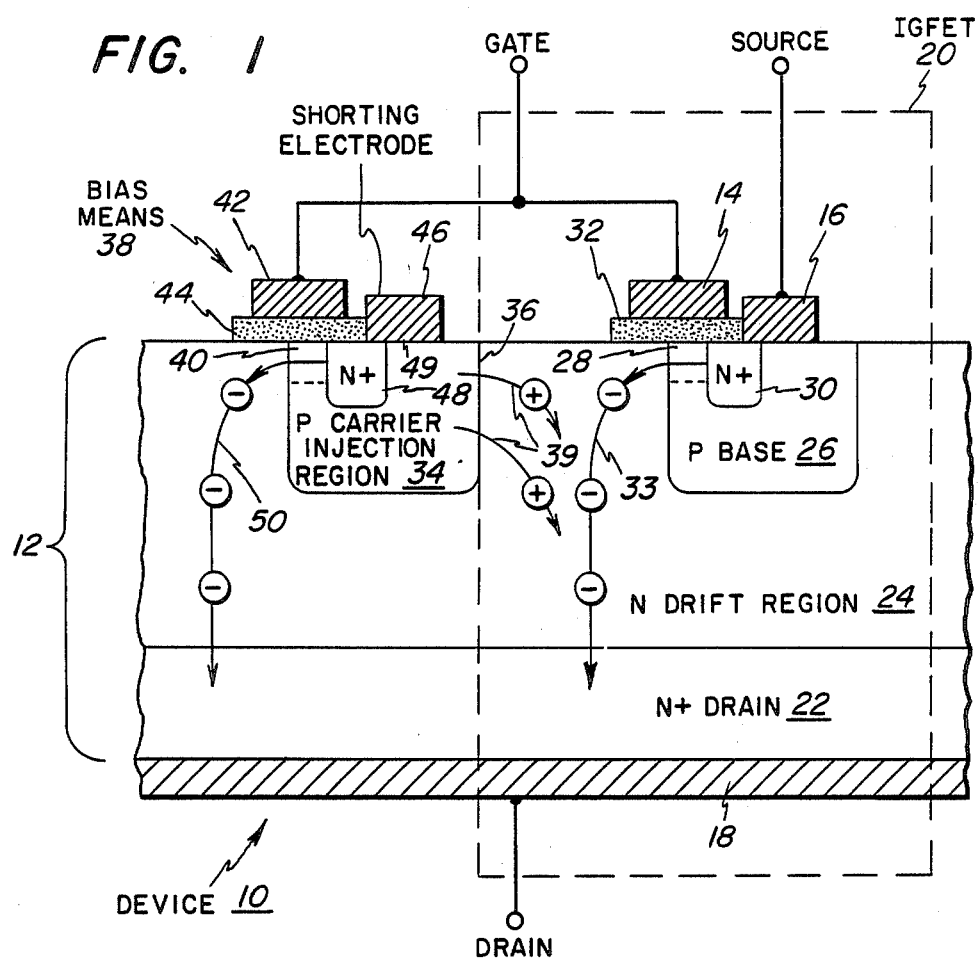
FIG. 1 is a schematic view in cross-section of a portion of a semiconductor device in accordance with my invention.

There is illustrated in FIG. 1 a single cell, or repeated structure, of a semiconductor device 10 in accordance with my invention. Each cell of device 10 suitably is alike any other cell; therefore, a description of only the illustrated cell follows.

Semiconductor device 10 includes a semiconductor body 12, preferably of silicon. An IGFET 20 is incorporated within semiconductor device 10 and includes, in successive and adjacent arrangement, an N+ drain region 22, an N drift region 24, a P base region 26, and a channel region 28, i.e., a region in which a conductive region or channel exists during forward conduction of IGFET 20. Also included in IGFET 20 is an N+ source region 30, adjoining both channel region 28 and P base region 26. IGFET 20 further includes gate, source, and drain electrodes 14, 16, and 18, respectively. Source electrode 16 adjoins both P base region 26 and N+ source region 30, and serves as a source electrode for device 10. Drain electrode 18 adjoins N+ drain region 22 and serves as drain electrode for device 10. Channel region 28 of IGFET 20 is preferably constructed of P conductivity type semiconductor material, whereby device 10 exhibits normally-off performance. Gate electrode 14 is insulatingly spaced from channel region 28 by dielectric film 32, preferably an oxide of semiconductor wafer 12. As will be manifest to those skilled in the art, a positive bias on gate electrode 14 (with respect to source electrode 16), of sufficient magnitude, induces in channel region 28 an inversion layer (or conductive region) of electrons, so as to complete an electron current path 33 extending from source electrode 16 to N drift region 24, via N+ source region 30 and channel region 28.

N+ source region 30 may be omitted from IGFET 20, as will be manifest to those skilled in the art, in which case a channel region 28 would need to be modified to extend all the way from N drift region 24 to source electrode 16. This would be accomplished by modifying gate electrode 14 so that it overlies the entire modified channel region 28.

IGFET 20 could be further modified by fabricating a channel region 28 of N conductivity type semiconductor material, resulting in an IGFET 20 which is known in the art as a normally-on device. That is, such modified IGFET 20 would require an active bias voltage on gate electrode 14 (specifically, a negative voltage with respect to souce electrode 16) in order to turn off device 10 by depleting channel region 28 of electrons so that it becomes non-conductive to electrons.

Semiconductor device 10 further includes a P carrier injection region 34 adjoining N drift region 24 of IGFET 20 so as to form a P-N junction 36 therewith. In accordance with an object of my invention, bias means 38, discussed in detail below, is provided in order to forward bias P-N junction 36 by more than 0.6 volts (at least for silicon devices) when device 10 is in the "on", or conducting, state. This causes P carrier injection region 34 to inject holes into N drift region 24 of IGFET 20, as illustrated by hole current paths 39. As a result, the on-resistance of N drift region 24 is markedly reduced, due to a corresponding increase in electron population in drift region 24 originating from electron current path 33. That the electron population in N drift region 24 increases as the hole population therein increases is in accordance with the principle of quasi-neutrality holding that an approximate balance between holes and electrons in a semiconductor region must exist in order to avoid high electric fields therein.

To forward bias P-N junction 36, I particularly prefer to utilize bias means 38, which includes a channel region 40, preferably of P conductivity type, and a gate electrode 42 insulatingly spaced from channel region 40 by dielectric film 44, such as silicon dioxide. Gate electrode 42 is preferably interconnected ohmically with IGFET gate electrode 14, as illustrated schematically, so that a single control signal can operate semiconductor device 10. This requires, however, that both channel regions 40 and 28 (of IGFET 20) be of the same conductivity type semiconductor material. With channel region 40 being of P conductivity type semiconductor material, a positive bias on gate electrode 42 (with respect to source electrode 16), sufficient in magnitude, will induce an inversion layer (or conductive region) in channel region 40. Conversely, if channel region 40 is of N conductivity type semiconductor material, then a negative bias on gate electrode 42 of sufficient magnitude is required to deplete channel region 40 of electrons so that it no longer is conductive to electrons.

To complete bias means 38, a shorting electrode 46 adjoins P carrier injection region 34 but is electrically isolated from source electrode 16, and an N+ region 48 is electrically interposed between shorting electrode 46 and channel region 40. With gate electrode 42 biased with a positive voltage sufficient to invert P-type channel region 40, a current path 50 for electrons is completed from shorting electrode 46 to N drift region 24 via N+ region 48 and the inversion layer within channel region 40. Alternatively, if N+ region 48 were omitted, channel region 40 would need to be modified to extend all the way from N drift region 24 to shorting electrode 46. This can be accomplished by modifying gate electrode 42 so that it would overlie the entire modified channel region 40.

In operation of semiconductor device 10 in a conductive state and with channel regions 28 and 40 each comprising P conductivity type semiconductor material, a positive bias on gate electrodes 14 and 42 (with respect to source electrode 16), of sufficient magnitude, induces inversion layers (or conductive regions) in channel regions 28 and 40. With a positive voltage on drain electrode 18 (with respect to source electrode 16), electron current flow is induced in current path 33 from source electrode 16 to N drift region 24, via N+ source region 30 and the inverted channel region 28. Simultaneously, electron current flow is induced in current path 50 from shorting electrode 46 to drain electrode 18, via N+ region 48, the inverted channel region 40, N drift region 24, and N+ drain region 22. The level of current in electron current path 50 is negligible, however, until the voltage on drain electrode 18 exceeds about 0.6 volts (at least for silicon devices) so as to raise the potential of shorting electrode 46 by approximately this voltage. With electrode 46 so raised in potential, P-N junction 36 becomes forward biased by an amount sufficient to cause injection of holes from P carrier injection region 34 into N drift region 24, as in hole current paths 39. The holes and electrons for current paths 39 and 50, respectively, are provided by hole-electron pair generation at interface 49, between shorting electrode 46 and P carrier injection region 34. This results in the level of current flow in electron current path 50 rising at the same rate as the level of current flow of hole current in paths 39.

The increase in hole concentration in N drift region 24 due to current flow in hole current paths 39 induces in region 24 an increase in electron concentration sufficient to markedly reduce the resistance of N drift region 24. Because region 24 typically has a considerably higher resistance to electron current flow than any of the other illustrated regions of device 10 through which electron current path 33 passes, the lowering of on-resistance in region 24 results in a like lowering of the on-resistance of semiconductor device 10. Quantitatively, a 200-volt device 10 in accordance with my invention is expected to have an on-resistance of about one-tenth that of a 200-volt IGFET not incorporating my invention, while a 1000-volt device 10 incorporating my invention is expected to have an on-resistance of about one-hundredth that of an IGFET not incorporating my invention.

Semiconductor device 10 advantageously can be fabricated with conventional technology for making IGFETs that is only slightly modified. This can be appreciated from considering the right half of FIG. 1, including IGFET 20, which is structurally similar to the illustrated left half of device 10, with the sole exception being that shorting electrode 46 is electrically isolated from source electrode 16; that is, a conventional IGFET would result if shorting electrode 46 were instead interconnected with source electrode 16. Accordingly, device 10 of my invention can be fabricated by modifying a conventional process for fabricating an IGFET simply by not interconnecting every alternate metallization on the upper surface of wafer 12 that adjoins a P conductivity type region, such as shorting electrode 46, with source electrode metallization, such as source electrodes 16.

Figure 2:
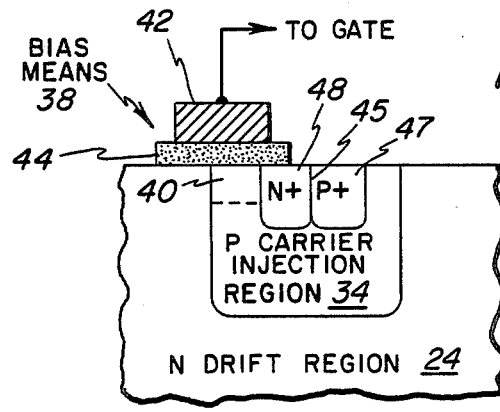
FIG. 2 is a detail view illustrating a modification of bias means 38 of FIG. 1.

An alternative implementation of bias means 38 is illustrated in the detail view of FIG. 2. As shown in this Figure, P+ region 47 is provided and adjoins both N+ region 48 and P carrier injection region 34. P+ region 47 and N+ region 48 have sufficiently high doping concentrations so that P-N junction 45, extant between P+ region 47 and N+ region 48, constitutes a tunnel junction, which functions as an ohmic short or connection between regions 47 and 48. Since juxtaposed regions 47 and 34 are of like conductivity type and are thus ohmically connected together, the provision of tunnel junction 45 can be appreciated as obviating the need for a shorting electrode between regions 48 and 34, such as shorting electrode 46 of FIG. 1. If desired, P+ region 47 could be made larger so as to occupy the entire right half of the illustrated portion of P carrier injection region 34. This would be desirable, for example, if gate electrode 14 for IGFET 20 (FIG. 1) were to overlie the right half of P carrier injection region 34, in order to prevent a biasing voltage on gate electrode 14 from inducing an unwanted inversion layer in the less heavily-doped region 34.

A significant feature of semiconductor device 10 is that it is of a particularly compact size. Other embodiments of my invention are contemplated which do not, however, attain such a compact size, but, nevertheless, attain the advantages of low on-resistance, a high impedance gate, and, if desired, normally-off operation. By way of example, another such embodiment is illustrated in FIG. 3.

Referring now to FIG. 3, a single cell of a semiconductor device 100 is illustrated. Reference numerals in FIG. 3 that are like reference numerals in FIG. 1 refer to like parts. Device 100 comprises an IGFET 20', suitably identical to IGFET 20 of FIG. 1. Device 100 further includes a P carrier injection region 34' adjoining N drift region 24' of IGFET 20'. P carrier injection region 34' functions in the same manner as P carrier injection region 34 of device 10 of FIG. 1; however, it is biased with a bias means 38', which differs from bias means 38 of device 10 in that it includes a P region 102 separate from P carrier injection region 34'. This requires that shorting electrode 46' of bias means 38' be ohmically connected to P carrier injection region 34', for example, with electrode 104 adjoining region 34' and a conductive connection 106 between shorting electrode 46' and electrode 104.

Semiconductor device 100 operates in essentially the same manner as semiconductor device 10 of FIG. 1, as is discussed above, and can be fabricated through the use of known techniques used in fabricating IGFETs.

Semiconductor device 100 could be readily modified to provide other embodiments of my invention, such as by incorporating instead of bias means 38' a modified bias means (not shown) in an entirely separate semiconductor device which would be conductively coupled to P carrier injection region 34'.

The foregoing describes an insulated-gate semiconductor device with low on-resistance and which may readily be fabricated so as to exhibit normally-off performance. A particularly preferred embodiment of the device attains a compact size and can be fabricated with only a slight modification to a conventional technique for making IGFETs.

While only certain preferred features of my invention have been shown by way of illustration, many modifications and substitutions will occur to those skilled in the art. For example, complementary devices could be fabricated in which P conductivity type semiconductor material is used in lieu of N conductivity type semiconductor material, and visa versa. Additionally, the gate electrodes described above could be fabricated from highly-doped polysilicon or other refractory material, as opposed to the metallization schematically depicted in the drawings. Further, while the devices illustrated herein are of the diffused region metal-oxide-semiconductor (DMOS) type, devices of the etched "V"-groove metal-oxide-semiconductor (VMOS) type could also be made. It is, therefore, to be understood that the appended claims are intended to cover all such modifications and substitutions as fall within the true spirit of my invention.

What I claim as my invention and desire to have secured by Letters Patent of the United States is:

1. An insulated-gate semiconductor device with low on-resistance, comprising:
    (a) an insulated-gate field-effect transistor including, in successive arrangement, a drain region, a drift region, a base region and a channel region; said base region being of one conductivity type and said drain and drift regions being of the opposite conductivity type; and further including a plurality of external contacts for connection of said device into a circuit; a drain electrode attached to said drain region and ohmically connected to a first one of said external contacts, a source electrode attached to said base region and ohmically connected to a second one of said external contacts and a gate electrode ohmically connected to a third one of said external contacts and insulatingly spaced from said channel region to determine the conductive state of said channel region in response to bias voltage thereon;
    (b) a carrier injection region adjoining said drift region and being of the one conductivity type so as to form a P-N junction with said drift region, said carrier injection region being free of ohmic connections to said external contacts; and
    (c) bias means connected to said carrier injection region and effective during the on state of the semiconductor device for forward biasing said P-N junction by an amount sufficient to induce injection of one type carriers from said carrier injection region, across said P-N junction, and into said drift region, thereby reducing the on-resistance of said drift region and of the semiconductor device.

2. The semiconductor device of claim 1 wherein said bias means comprises:
    (a) an injection region electrode contacting said carrier injection region and spaced from said drift region;
    (b) a second channel region adjoining said carrier injection region and, when in a conductive state, completing a current path of the opposite conductivity type extending from said drift region to said injection region electrode; and
    (c) a second gate electrode insulatingly spaced from said second channel region so as to be effective to determine the conductive state of said second channel region in response to a bias thereon.

3. An insulated-gate semiconductor device with low on-resistance, comprising:
    (a) an insulated-gate field-effect transistor including, in successive arrangement, a drain region, a drift region, a base region and a first channel region; said base region being of one conductivity type and said drain and drift regions being of the opposite conductivity type; and further including a drain electrode attached to said drain region, a source electrode attached to said base region, and a first gate insulatingly spaced from said channel region to determine the conductive state of said channel region in response to a bias voltage thereon;

(b) a carrier injection region adjoining said drift region and being of the one conductivity type so as to form a P-n junction with said drift region, said carrier injection region being free of ohmic connections to said source electrode and to said gate electrode; and (c) bias means connected to said carrier injection region and effective during the on state of the semiconductor device for forward biasing said P-N junction by an amount sufficient to induce injection of one type carriers from said carrier injection region, across said P-N junction, and into said drift region, thereby reducing the on-resistance of said drift region and of the semiconductor device wherein said bias means comprises:

(1) an injection region electrode contacting said carrier injection region and spaced from said drift region;

(2) a second channel region adjoining said carrier injection region and, when in a conductive state, completing a current path of the opposite conductivity type extending from said drift region to said injection region electrode;

(3) a second gate electrode insulatingly spaced from said second channel region so as to be effective to determine the conductive state of said second channel region in response to a bias thereon; and (4) a region of the opposite conductivity type spaced from said drift region and adjoining said carrier injection region and being electrically interposed between said second channel region and said injection region electrode so as to be in said current path from said drift region to said injection region electrode.

4. The semiconductor device of claim 2 wherein said first mentioned channel region and said second channel region each comprise semiconductor material of the one conductivity type, whereby the semiconductor device exhibits normally-off performance.

5. The semiconductor device of claim 2 wherein said first mentioned gate electrode and said second gate electrode are ohmically connected together, whereby a single control signal is effective to control the conductive state of the semiconductor device.

6. An insulated-gate semiconductor device with low on-resistance, comprising:
(a) an insulated-gate field-effect transistor including, in successive arrangement, a drain region, a drift region, a base region and a channel region; said base region being of one conductivity type and said drain and drift regions being of the opposite conductivity type; and further including a drain electrode attached to said drain region, a source electrode attached to said base region, and a gate electrode insulatingly spaced from said channel region to determine the conductive state of said channel region in response to a bias voltage thereon;

(b) a carrier injection region adjoining said drift region and being of the one conductivity type so as to form a P-N junction with said drift region; and (c) bias means connected to said carrier injection region and effective during the on state of the semiconductor device for forward biasing said P-N junction by an amount sufficient to induce injection of one type conductivity carriers from said carrier injection region, across said P-N junction, and into said drift region, thereby reducing the on-resistance of said drift region and of the semiconductor device, whereby said bias means comprises:

(1) a first highly-doped region of the one conductivity type adjoining said carrier injection region;

(2) a second highly-doped region of the opposite conductivity type spaced from said drift region and adjoining both said carrier injection region and said first highly-doped region, said first and second highly-doped regions being doped sufficiently high in concentration as to form a tunnel junction therebetween;

(3) a second channel region adjoining said carrier injection region and, when said second channel region is in a conductive state, completing a current path of the opposite conductivity type extending from said drift region to said second highly-doped region; and (4) a second gate electrode insulatingly spaced from said second channel region so as to be effective to determine the conductive state of said second channel region in response to a bias voltage.

7. The semiconductor device of claim 6 wherein said first mentioned channel region and said second channel region each comprise semiconductor material of the one conductivity type, whereby the semiconductor device exhibits normally-off performance.

8. The semiconductor device of claim 6 wherein said first mentioned gate electrode and said second gate electrode are ohmically connected together, whereby a single control singal is effective to control the conductive state of the semiconductor device.

9. An insulated-gate semiconductor device with low on-resistance, comprising:
(a) an insulated-gate field-effect transistor including, in successive arrangement, a drain region, a drift region, a base region and a first channel region; said base region being of one conductivity type and said drain and drift regions being of the opposite conductivity type; and further including a drain electrode attached to said drain region, a source electrode attached to said base region, and a first gate electrode insulatingly spaced from said first channel region to determine the conductive state of said first channel region in response to a bias voltage thereon;

(b) a carrier injection region adjoining said drift region and being of the one conductivity type so as to form a P-N junction with said drift region; and (c) bias means connected to said carrier injection region and effective during the on state of the semiconductor device for forward biasing said P-N junction by an amount sufficient to induce injection of one type carriers from said carrier injection region, across said P-N junction, and into said drift region, thereby reducing the on-resistance of said drift region and of the semiconductor device, wherein said bias means comprises:

(1) a further region of the one conductivity type adjoining said drift region and spaced from said carrier injection region;

(2) a further region electrode adjoining said further region and being ohmically connected to said carrier injection region, but being free of ohmic connections to said source electrode;

(3) a second channel region adjoining said further region and, when in a conductive state, completing a current path of the opposite conductivity type extending from said drift region to said further region electrode; and (4) a second gate electrode insulatingly spaced from said second channel region so as to be effective to determine the conductive state of said second channel region in response to a bias voltage thereon.

10. The semiconductor device of claim 9 wherein said first channel region and said second channel region each comprise semiconductor material of the one conductivity type, whereby the semiconductor device attains normally-off performance.

11. The semiconductor device of claim 9 wherein said first gate electrode and said second gate electrode are ohmically connected together, whereby a single control signal is effective to control the conductive state of the semiconductor device.

12. The semiconductor device of claim 1 wherein the semiconductor device comprises silicon.

13. The semiconductor device of claim 11 wherein said base region of said insulated-gate field-effect transistor comprises P conductivity type semiconductor material, and said drift and drain regions of said insulated-gate field-effect transistor comprise N conductivity type semiconductor material.

14. The semiconductor device in accordance with claim 1 further including a source region in successive arrangement with said base region, said channel region being contiguous with said source region and underlying said gate electrode.

15. The semiconductor device of claim 1 wherein said bias means controllably couples said carrier injection region to said drain region.

16. An insulated-gate semiconductor device with low on-resistance, comprising:

(a) an insulated-gated field-effect transistor including, in successive arrangement, a drain region, a drift region, a base region and a channel region; said base region being of one conductivity type and said drain and drift regions being of the opposite conductivity type; and further including a plurality of external contacts for connection of said device into a circuit; a drain electrode attached to said drain region and ohmically connected to a first one of said external contacts, a source electrode attached to said base region and ohmically connected to a second one of said external contacts, and a gate electrode ohmically connected to a third one of said external contacts and insulatingly spaced from said channel region to determine the conductive state of said channel region in response to a bias voltage thereon;

(b) a carrier injection region adjoining said drift region and being of the one conductivity type so as to form a P-N junction with said drift region, said carrier injection region being free of ohmic connections to said external contacts; and (c) means for controllably coupling said carrier injection region to said drain region comprising a first region of one type conductivity disposed within said drift region and a second region of said opposite type conductivity disposed within said first region.

17. The semiconductor device of claim 16 wherein said means for coupling said carrier injection region to said drain region further comprises an insulated gate structure, associated with said first region, which in response to an appropriate applied bias, controllably couples opposite type conductivity carriers between said drift region and said second region.

18. The semiconductor device of claim 17 wherein said means for coupling said carrier injection region to said drain region includes an ohmic electrical connection between said first region and said carrier injection region.

19. The semiconductor device in accordance with claim 3 wherein said channel region is of said one conductivity type.

20. The semiconductor device in accordance with claim 6 wherein said channel region is of said one conductivity type.

* * * * *